United States Patent
Johnson

[11] Patent Number: 6,144,213
[45] Date of Patent: Nov. 7, 2000

[54] BALL GRID ARRAY PROBING TECHNIQUE

[75] Inventor: Kenneth W. Johnson, Colorado Springs, Colo.

[73] Assignee: Agilent Technologies, Palo Alto, Calif.

[21] Appl. No.: 09/072,952

[22] Filed: May 5, 1998

[51] Int. Cl.[7] .............................. G01R 1/02; H01R 12/32; H05K 1/11
[52] U.S. Cl. ........................................... 324/754; 324/755
[58] Field of Search .................................. 324/754, 755, 324/758, 765

[56] References Cited

U.S. PATENT DOCUMENTS

| | | | |
|---|---|---|---|
| 5,418,471 | 5/1995 | Kardos ..................................... | 324/758 |
| 5,559,446 | 9/1996 | Sano ........................................ | 324/760 |
| 5,784,262 | 7/1998 | Sherman .................................. | 361/777 |
| 5,831,444 | 11/1998 | Pai ........................................... | 324/758 |
| 5,880,590 | 3/1999 | Desai et al. ............................. | 324/757 |
| 5,932,891 | 8/1999 | Higashi et al. ..................... | 324/755 X |
| 5,936,845 | 8/1999 | Soejima et al. .................... | 324/755 X |
| 5,940,278 | 8/1999 | Schumacher ......................... | 324/755 X |
| 5,952,840 | 9/1999 | Farnworth et al. ..................... | 324/755 |

FOREIGN PATENT DOCUMENTS

| | | | |
|---|---|---|---|
| 0840129A2 | 5/1998 | European Pat. Off. .......... | G01R 1/04 |
| 0840129A3 | 6/1999 | European Pat. Off. .......... | G01R 1/04 |
| WO 86/06841 | 11/1986 | WIPO ............................. | G01R 31/02 |

*Primary Examiner*—Glenn W. Brown

[57] ABSTRACT

A printed circuit assembly includes a printed circuit board with an electrically conductive via formed therein that extends from the front side of the printed circuit board to the back side of the printed circuit board. A ball grid array package mounted to the front side of the printed circuit board is electrically connected to the electrically conductive via. A probe pad formed on the back side of the printed circuit board is laterally displaced from the electrically conductive via and is electrically connected thereto. A solder mask layer deposited on the back side of the printed circuit board includes a probe pad aperture formed therein that is substantially aligned with the probe pad so that the probe pad is exposed by the probe pad aperture formed in the solder mask layer.

12 Claims, 4 Drawing Sheets

BALL GRID ARRAY PROBING TECHNIQUE

FIELD OF THE INVENTION

The present invention relates generally to electronic test equipment and more particularly to a test probe assembly and method for electrically connecting the leads of an integrated circuit package to an electronic measurement device.

BACKGROUND OF THE INVENTION

Integrated circuit (IC) packages are typically comprised of an insulated housing with a plurality of lead connectors extending outwardly from the housing. One common IC package is the dual in-line package (DIP) in which electrical leads are brought out along two sides of the housing. Another common IC package is the quad flat package (QFP) in which the leads are brought out along four sides. Another package design is the ball grid array, where the lead connectors extend from the bottom of the IC. As IC's get larger, with a corresponding increase in the number of connections needed between the IC and the PC board, the IC package designs that only use the edge of the IC for connections are less desirable. Some of the disadvantages of the IC package designs that use only the edges for connections are the limited space available along the edges and the length of the traces from the IC to the PC board. The ball grid array package design overcomes these limitations by using the area underneath the IC package as the place to route the lead connector between the IC and the PC board.

Electronic test equipment (e.g., oscilloscope, logic analyzer, and emulator) is used to analyze various electrical aspects of the IC including voltage and current waveforms. Typically, a loaded printed circuit board is crowded with various electrical components, including multiple IC packages. Due to the close spacing of components on the board (i.e., high "board density"), as well as the small size and pitch of each IC package lead, it is often difficult to manipulate each lead with a test probe to electrically connect each lead to the test equipment. This problem of electrically connecting to the IC leads is made impossible for the ball grid array package because many of the signals are hidden under the IC package after the IC package is mounted onto the PC board. There is a need to probe the signals coming from an IC packaged in a ball grid array.

SUMMARY OF THE INVENTION

The present invention creates a predetermined pattern of probe points on the PC board by extending the vias already on the board through to the backside of the PC board. This allows the signals coming from the IC, packaged in a ball grid array, to be probed on a production PC board, without adding additional components.

In one preferred embodiment, the present invention may comprise a printed circuit assembly that includes a printed circuit board with an electrically conductive via formed therein that extends from the front side of the printed circuit board to the back side of the printed circuit board. A ball grid array package mounted to the front side of the printed circuit board is electrically connected to the electrically conductive via. A probe pad formed on the back side of the printed circuit board is laterally displaced from the electrically conductive via and is electrically connected thereto. A solder mask layer deposited on the back side of the printed circuit board includes a probe pad aperture formed therein that is substantially aligned with the probe pad so that the probe pad is exposed by the probe pad aperture formed in the solder mask layer.

DETAILED DESCRIPTION OF THE INVENTION

Figure 1:
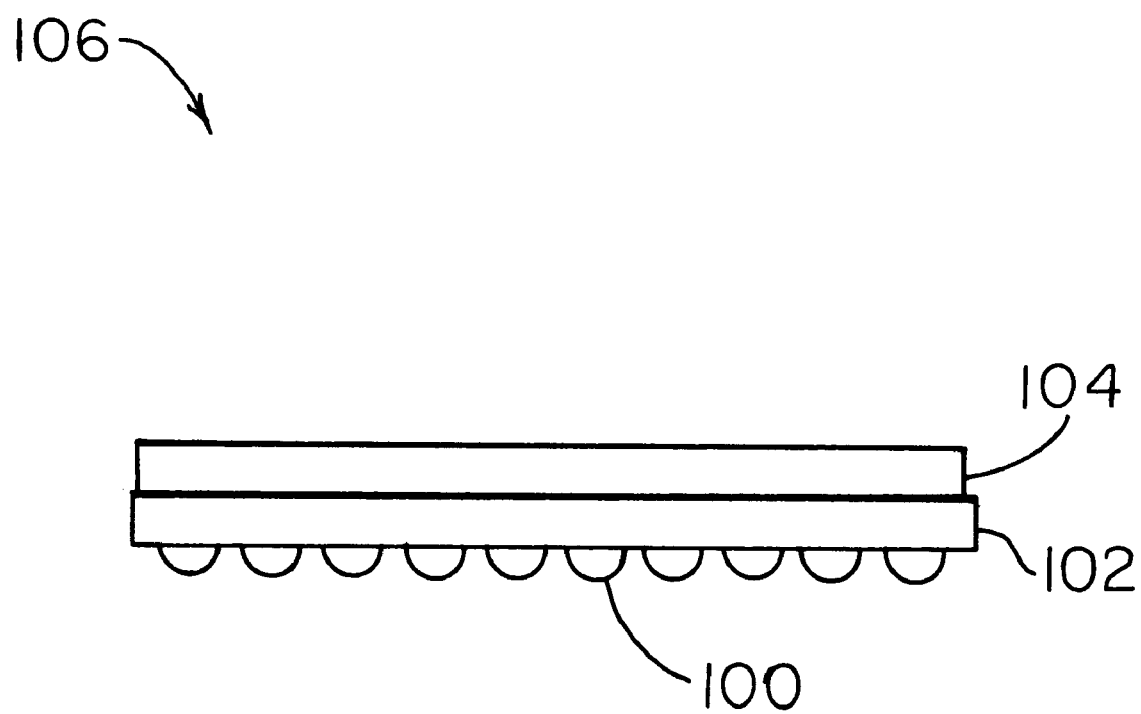
FIG. 1 is a side view of a ball grid array IC package.

This invention provides a plurality of probe pads 200 on the backside 408 of a circuit board 400 that can be accessed with a probe 410 to sample the signals coming from or going to an integrated circuit (IC) (not shown) mounted in a ball grid array package 106. The side 416 of the circuit board 400 that has most if not all of the components mounted thereon is considered to be the frontside of the circuit board 400. FIG. 1 shows a side view of the ball grid array package 106 with a plurality of solder balls or electrical leads 100. The ball grid array package 106 has a substrate 102, which mounts the electronic components (not shown) such as an integrated circuit (IC). A cover 104 mounted over the electronic components and attached to the substrate 102 aids in protecting components from damage.

Figure 2:
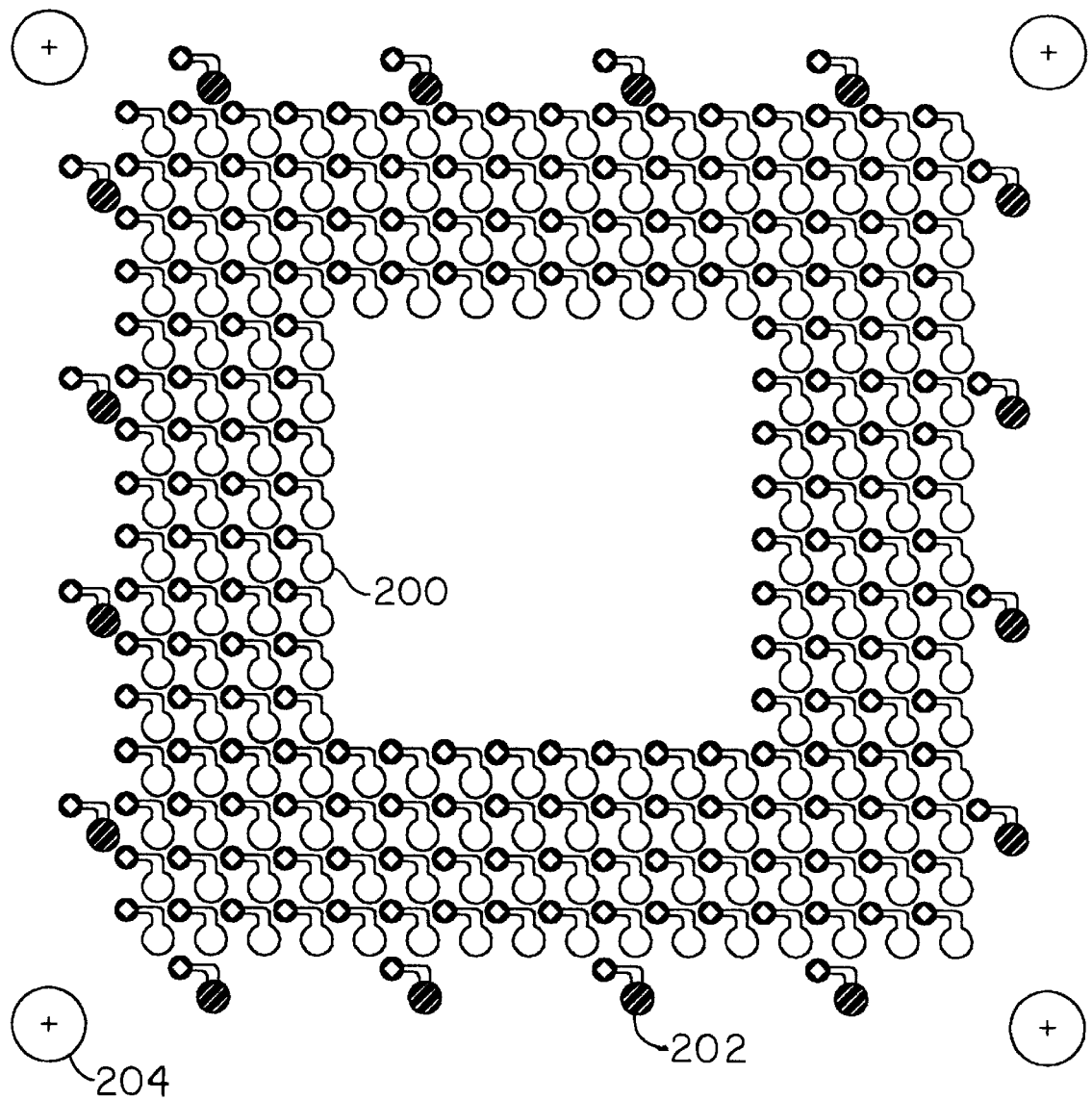
FIG. 2 is a plan view of a probe pattern which may be incorporated into a printed circuit board.

With reference to FIG. 2, the plurality of probe pads 200 provided on the backside 408 of circuit board 400 may be arranged in a predetermined pattern. In the preferred embodiment, the predetermined pattern of probe pads 200 is a square pattern. The number of probe pads 200 in the predetermined pattern of probe pads 200 can be greater than, equal to, or less than the number of leads originating on the ball grid array package 106. In addition to the probe pads 200, the backside 408 of circuit board 400 also may be provided with a plurality of ground pads 202 surrounding the predetermined pattern of probe pads 200. The ground pads 202 allow the probe 410 to be connected to the ground plane (not shown) of the circuit board 400 to minimize the electrical noise in the probe pad locations. The predetermined pattern of probe pads 200 is located in x and y with respect to the reference locating holes 204. The reference locating holes 204 in circuit board 400 allow a probe 410 to be easily attached to the circuit board 400 in such a way that the connecting points on the probe 410 line up with the predetermined pattern of probe pads 200 on the circuit board 400. See FIG. 4.

Figure 3:
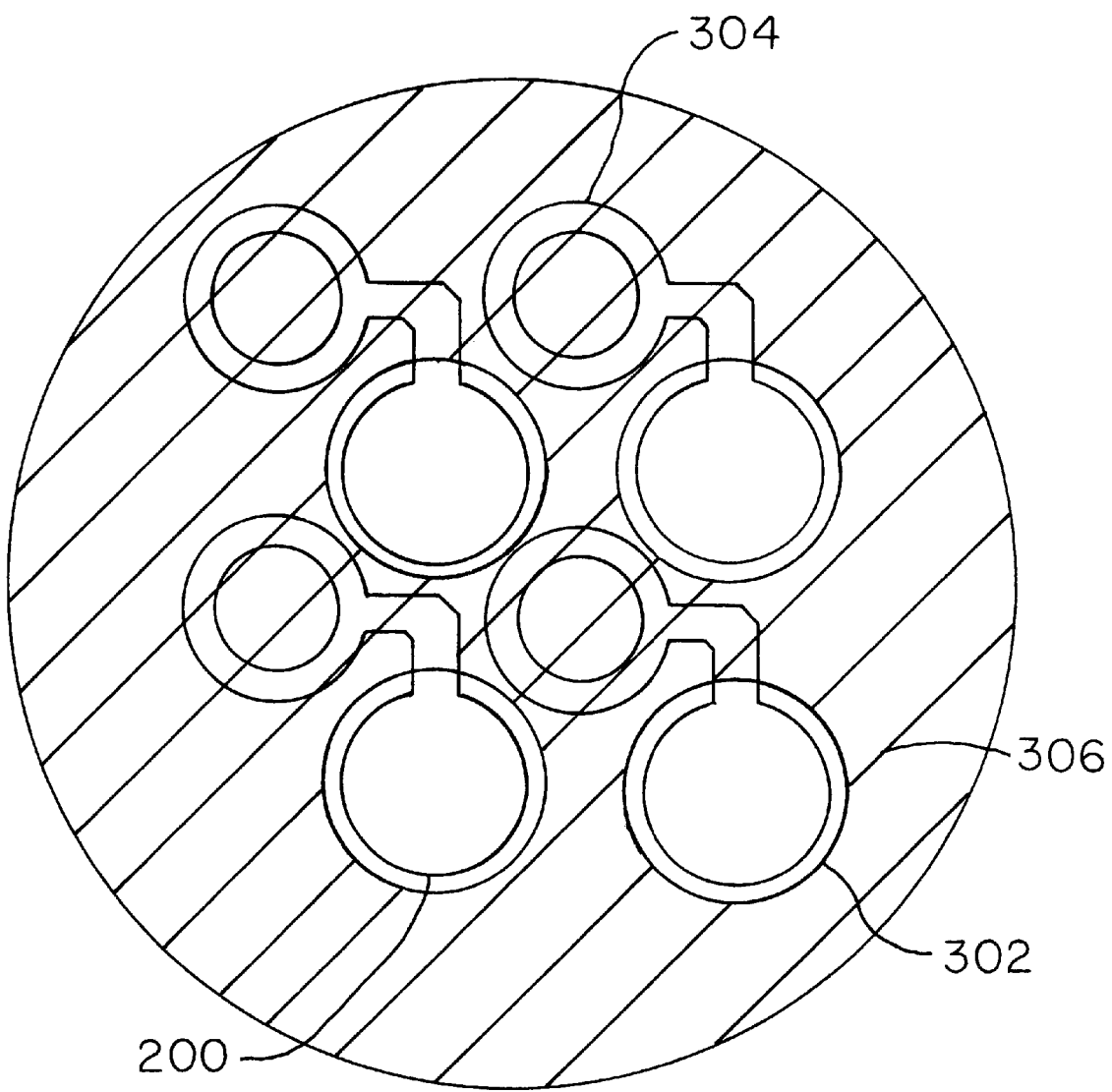
FIG. 3 is an enlarged view of the front view of a ball grid array probe pattern.

FIG. 3 shows a close up view of the probe pads 200 contained on the backside 408 of circuit board 400. For this illustration only four probe pads 200 are shown. The probe pads 200 can be made from gold or any other electrically conductive material. The probe pads 200 are exposed by a plurality of openings 302 in the solder mask layer 306, provided on the backside 408 of circuit board 400. Each opening 302 corresponds to a separate probe pad 200. Each probe pad 200 is connected to a via 304 that extends from the frontside 416 of circuit board 400 through to the backside 408 of circuit board 400. The solder mask 306 covers the plurality of vias 304 on the bottom of the circuit board 400. The solder balls 100 on the ball grid array package 106 are bonded to the vias 304 on the frontside 416 of printed circuit board 400 or to bonding pads (not shown) connected to the vias 304 on the frontside 416 of printed circuit board 400.

Figure 4:
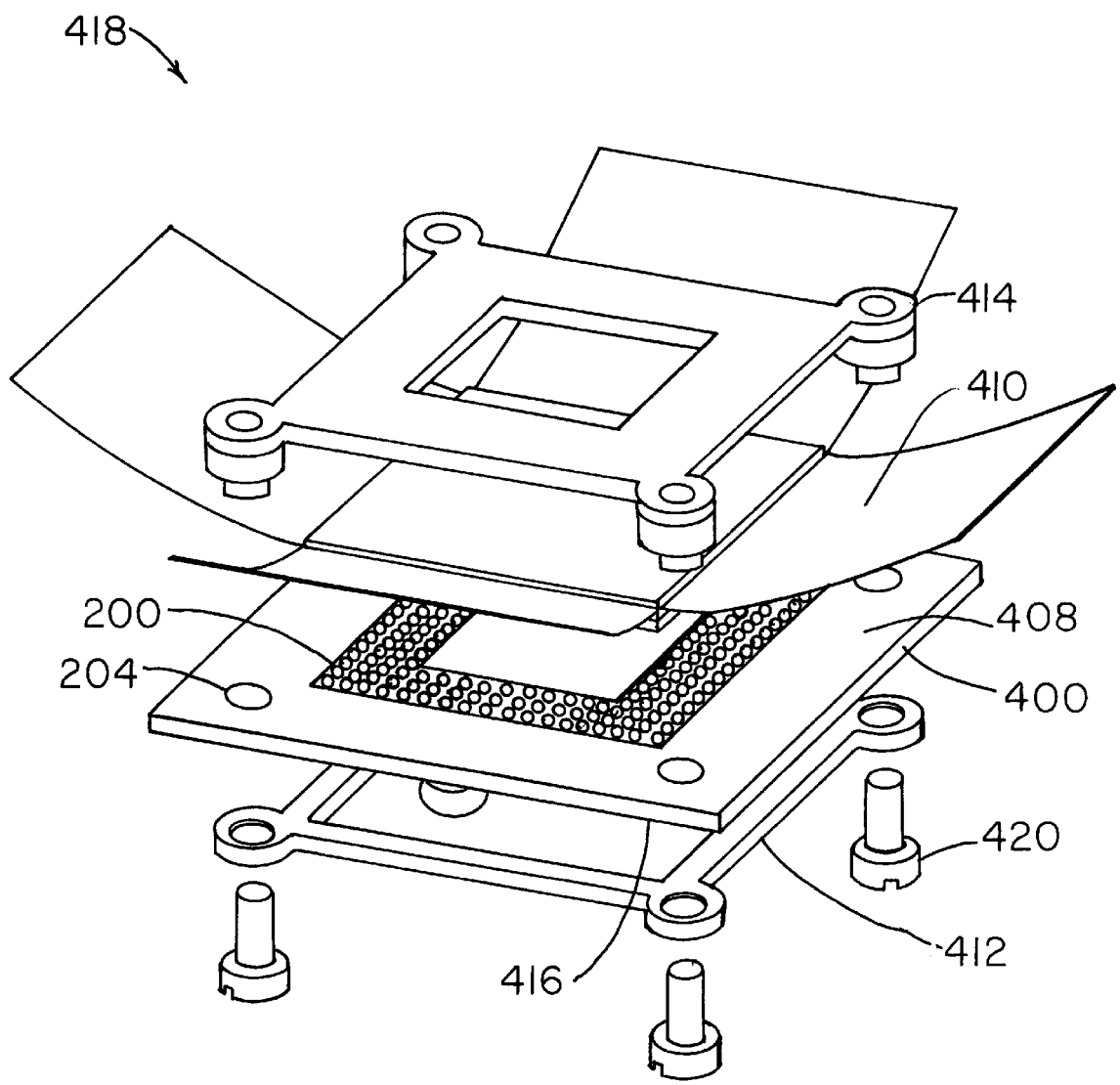
FIG. 4 is an exploded, perspective view of a probe assembly mating to the ball grid array probe pattern.

FIG. 4 shows how a probe 410 would be attached to the backside 408 of circuit board 400 using the reference holes 204 and an alignment frame 418 comprising a frontside piece 412 and a backside piece 414. The front and backside pieces 412, 414 of alignment frame 418 may be secured together by any of a wide range of suitable pin-like members, such as screws 420. The probe 410 is positioned between the backside 408 of circuit board 400 and the backside piece 414 of alignment frame 418 so that the appropriate contacts (not shown) of probe 410 contact the predetermined pattern of probe pads 200 on the backside 408 of the circuit board 400. The IC in the ball grid array package 106 (FIG. 1) is mounted on the component (or front) side 416 of the circuit board 400. The method used by the probe 410 to contact the predetermined pattern of probe pads 200 on the backside 408 of circuit board 400 is not part of this invention and any of the methods known by one skilled in the art could be used.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A printed circuit assembly, comprising:
    a printed circuit board having a front side and a back side, the printed circuit board having at least one electrically conductive via formed therein, said at least one electrically conductive via extending from the front side of said printed circuit board to the back side of said printed circuit board;
    a ball grid array package having an electronic circuit contained therein, said ball grid array package being mounted to the front side of said printed circuit board so that at least one circuit node of the electronic circuit contained in said ball grid array package is electrically connected to said at least one electrically conductive via;
    at least one probe pad formed on the back side of said printed circuit board, said at least one probe pad being electrically connected to said at least one electrically conductive via, said at least one probe pad also being laterally displaced from said at least one electrically conductive via, said at least one probe pad being located in a predetermined pattern on the back side of said printed circuit board and corresponding to a predetermined signal to be sampled; and
    a solder mask layer deposited on the back side of said printed circuit board, said solder mask layer having at least one probe pad aperture formed therein, said at least one probe pad aperture in said solder mask layer being substantially aligned with said at least one probe pad so that said at least one probe pad is exposed by said at least one probe pad aperture formed in said solder mask layer.

2. The printed circuit assembly of claim 1, wherein said solder mask layer covers said at least one electrically conductive via.

3. The printed circuit assembly of claim 1, further comprising at least one ground pad formed on the back side of said printed circuit board, said at least one ground pad being electrically connected to a ground plane contained on said printed circuit board and wherein said solder mask layer deposited on the back side of said printed circuit board comprises at least one ground pad aperture therein, said at least one ground pad aperture in said solder mask layer being substantially aligned with said at least one ground pad so that said at least one ground pad is exposed by said at least one ground pad aperture formed in said solder mask layer.

4. The printed circuit assembly of claim 3, further comprising a probe having at least one signal contact thereon, said probe being positioned adjacent the back side of said printed circuit board so that said at least one signal contact on said probe makes electrical contact with said at least one probe pad exposed by said at least one probe pad aperture formed in said solder mask layer.

5. The printed circuit assembly of claim 4, wherein said probe includes at least one ground contact thereon, said probe being positioned adjacent the back side of said printed circuit board so that said at least one ground contact on said probe makes electrical contact with said at least one ground pad exposed by said at least one ground pad aperture formed in said solder mask layer.

6. The printed circuit assembly of claim 5, further comprising an alignment system operatively associated with said printed circuit board and said probe, said alignment system allowing said at least one signal contact on said probe to be aligned with said at least one probe pad and allowing said at least one ground contact on said probe to be aligned with said at least one ground pad.

7. The printed circuit assembly of claim 6, wherein said alignment system comprises:
    an aperture formed in said printed circuit board, said aperture formed in said printed circuit board having a predetermined positional relationship to said at least one probe pad; and
    an alignment frame operatively associated with said probe, said alignment frame including an aperture engaging member sized to be received by said aperture formed in said printed circuit board.

8. A printed circuit assembly, comprising:
    a printed circuit board having a front side and a back side, the printed circuit board having at least one electrically conductive via formed therein, said at least one electrically conductive via extending from the front side of said printed circuit board to the back side of said printed circuit board;
    a ball grid array package having an electronic circuit contained therein, said ball grid array package being mounted to the front side of said printed circuit board so that at least one circuit node of the electronic circuit is electrically connected to said at least one electrically conductive via;
    at least one probe pad formed on the back side of said printed circuit board, said at least one probe pad being electrically connected to said at least one electrically conductive via, said at least one probe pad also being laterally displaced from said at least one electrically conductive via, said at least one probe pad being located in a predetermined pattern on the back side of said printed circuit board and corresponding to a predetermined signal to be sampled;
    at least one ground pad formed on the back side of said printed circuit board, said at least one ground pad being electrically connected to a ground plane contained on said printed circuit board;

a solder mask layer deposited on the back side of said printed circuit board, said solder mask layer having at least one probe pad aperture formed therein and at least one ground pad aperture formed therein, said at least one probe pad aperture in said solder mask layer being substantially aligned with said at least one probe pad so that said at least one probe pad is exposed by said at least one probe pad aperture formed in said solder mask layer, said at least one ground pad aperture in said solder mask layer being substantially aligned with said at least one ground pad so that said at least one ground pad is exposed by said at least one ground pad aperture formed in said solder mask layer, said solder mask layer also covering said at least one electrically conductive via.

9. The printed circuit assembly of claim 8, further comprising a probe having at least one signal contact thereon and at least one ground contact thereon, said probe being positioned adjacent the back side of said printed circuit board so that said at least one signal contact on said probe makes electrical contact with said at least one probe pad exposed by said at least one probe pad aperture formed in said solder mask layer and so that said at least one ground contact on said probe makes electrical contact with said at least one ground pad exposed by said at least one ground pad aperture formed in said solder mask layer.

10. The printed circuit assembly of claim 9, further comprising an alignment system operatively associated with said printed circuit board and said probe, said alignment system allowing said at least one signal contact on said probe to be aligned with said at least one probe pad and allowing said at least one ground contact on said probe to be aligned with said at least one ground pad.

11. The printed circuit assembly of claim 10, wherein said alignment system comprises:

an aperture formed in said printed circuit board, said aperture formed in said printed circuit board having a predetermined positional relationship to said at least one probe pad and to said at least one ground pad; and an alignment frame operatively associated with said probe, said alignment frame including an aperture engaging member sized to be received by said aperture formed in said printed circuit board.

12. A printed circuit assembly, comprising:

a printed circuit board having a front side and a back side, the printed circuit board having at least one electrically conductive via formed therein, said at least one electrically conductive via extending from the front side of said printed circuit board to the back side of said printed circuit board;

a ball grid array package having an electronic circuit contained therein, said ball grid array package mounted to the front side of said printed circuit board so that at least one circuit node of the electronic circuit contained therein is electrically connected to said at least one electrically conductive via;

at least one probe pad formed on the front side of said printed circuit board, said at least one probe pad being electrically connected to said at least one electrically conductive via, said at least one probe pad also being laterally displaced from said ball grid array package, said at least one probe pad being located in a predetermined pattern on the front side of said printed circuit board and corresponding to a predetermined signal to be sampled; and a solder mask layer deposited on the front side of said printed circuit board, said solder mask layer having at least one probe pad aperture formed therein, said at least one probe pad aperture in said solder mask layer being substantially aligned with said at least one probe pad so that said at least one probe pad is exposed by said at least one probe pad aperture formed in said solder mask layer.

\* \* \* \* \*